United States Patent
Kuwabara et al.

(10) Patent No.: US 7,247,899 B2
(45) Date of Patent: Jul. 24, 2007

(54) SEMICONDUCTOR DEVICE, PHOTOELECTRIC CONVERSION DEVICE AND METHOD OF MANUFACTURING SAME

(75) Inventors: Hideshi Kuwabara, Kanagawa (JP); Hiroshi Yuzurihara, Kanagawa (JP); Takayuki Kimura, Kanagawa (JP); Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/937,382

(22) Filed: Sep. 10, 2004

(65) Prior Publication Data

US 2005/0056905 A1    Mar. 17, 2005

(30) Foreign Application Priority Data

Sep. 12, 2003    (JP)    ............... 2003-321533

(51) Int. Cl.
*H01L 31/062* (2006.01)
*H01L 31/113* (2006.01)

(52) U.S. Cl. ............ 257/293; 257/292; 257/462; 257/E27.133; 257/E31.053; 257/E31.084

(58) Field of Classification Search ......... 257/233, 257/290–293, 461, 462, E31.053, E31.084, 257/E25.032, E27.133
See application file for complete search history.

(56) References Cited

U.S. PATENT DOCUMENTS

| | | | |
|---|---|---|---|
| 5,184,203 A | 2/1993 | Taguchi | 257/370 |
| 5,248,624 A * | 9/1993 | Icel et al. | 438/201 |
| 5,260,228 A | 11/1993 | Taguchi | 437/53 |
| 5,302,534 A * | 4/1994 | Monk et al. | 438/234 |
| 5,534,069 A | 7/1996 | Kuwabara et al. | 118/719 |
| 5,962,882 A * | 10/1999 | Sin | 257/222 |
| 6,023,293 A | 2/2000 | Watanabe et al. | 348/294 |
| 6,156,657 A | 12/2000 | Kuwabara et al. | 438/688 |
| 6,225,670 B1 * | 5/2001 | Dierickx | 257/431 |
| 6,521,920 B2 * | 2/2003 | Abe | 257/223 |
| 7,110,028 B1 * | 9/2006 | Merrill | 348/294 |
| 2004/0238913 A1 * | 12/2004 | Kwon et al. | 257/492 |

FOREIGN PATENT DOCUMENTS

| | | | |
|---|---|---|---|
| JP | 4-176171 | | 6/1992 |
| JP | 05226627 A | * | 9/1993 |
| JP | 5-267606 | | 10/1993 |
| JP | 9-246514 | | 9/1997 |
| JP | 2000-232214 | | 8/2000 |

* cited by examiner

*Primary Examiner*—Jerome Jackson
*Assistant Examiner*—Matthew E. Warren
(74) *Attorney, Agent, or Firm*—Fitzpatrick, Cella, Harper & Scinto

(57) ABSTRACT

In a photoelectric conversion device having a buried layer in a part of an anode and a cathode of a photodiode, such as a CCD having a sensor structure and a CMOS sensor, well of the same conduction type as the conduction type of the buried layer can be disposed in a peripheral circuit and the potential of each well is independently controlled.

In a photoelectric conversion device which is constructed in such a manner that on the whole area of a substrate of a specific conduction type there are disposed a buried layer of a conduction type opposite to the conduction type of the substrate and an epitaxial layer of the same conduction type as the conduction type of the substrate and that well of a conduction type opposite to the conduction type of the substrate are present in a part of the epitaxial layer, buried layer for well isolation of the same conduction type as the conduction type of the substrate which have a higher concentration than the epitaxial layer is disposed between the lower part of the well and the buried layer.

6 Claims, 3 Drawing Sheets

SEMICONDUCTOR DEVICE, PHOTOELECTRIC CONVERSION DEVICE AND METHOD OF MANUFACTURING SAME

BACKGROUND OF THE INVENTION

1. Field of the Invention

The present invention relates to a photoelectric conversion device used as an image pickup device of a digital camera and the like and a method of manufacturing the photoelectric conversion device. This photoelectric conversion device relates to a semiconductor device having a buried layer in part of an anode or a cathode of a photodiode, such as a CCD having a sensor structure and a CMOS sensor.

2. Related Background Art

As prior art there is a photoelectric conversion device having a buried layer in a photodiode of a CCD and a CMOS sensor.

FIG. 4 is a conceptual drawing which shows the sectional structure of a photodiode part of a conventional photoelectric conversion device. The reference numeral 401 denotes a semiconductor substrate of Si etc. (the N type, by way of example), the numeral 402 a buried layer which defines the lower part of a photodiode (the P type, by way of example), the numeral 403 an epitaxial layer (the N type, by way of example), the numeral 404 a barrier diffusion layer, which defines a transverse photosensitive region of the photodiode (the P type, by way of example), and the numeral 405 a charge-storage diffusion layer of the photodiode (the N type, by way of example).

For a photodiode structure, it is possible to consider a CCD and a CMOS sensor under the same configuration requirements. In the case of this structure, the region surrounded by the buried layer 402 and the barrier diffusion layer 404 becomes a photosensitive region of each sensor. In this structure, the spectral responsibility of a sensor is determined by the material properties of the epitaxial layer 403, the position from the surface of the buried layer 402 and the concentration distribution of impurities in the buried layer 402. When the buried layer 402 is formed from Si, in order to adapt the spectral responsibility to the visible rays of human beings, it is desirable that the peak of the impurity concentration of the buried layer 402 be at a depth of not less than 3 µm from the surface.

What should be considered in this connection is how to form this buried layer 402. Prior art includes a method by which an epitaxial layer 403 is formed after the formation of a buried layer 402, as disclosed in the Japanese Patent Application Laid-Open No. 2000-232214 (pages 5 and 6, FIG. 2) and a method by which after the formation of an epitaxial layer 403, a buried layer 402 is later formed by use of the high-energy ion implantation process, as disclosed in the Japanese Patent Application Laid Open No. H09-246514 (paragraph 0073, FIG. 2). When a buried layer is to be formed on the whole area of a substrate 401 surface, both methods have no problem. However, when a buried layer 402 is to be formed in part of a substrate 401 surface, patterning by the photolithography process etc. is necessary in the former method. In the latter method, it is necessary to use an extremely thick mask for ion implantation.

On the basis of the above-described precondition, it is thought that in a peripheral part of a sensor, a driving circuit by a MOS transistor etc. is disposed in the same substrate. Not only in a CMOS sensor naturally, but also in a CCD, it is desirable that both an NMOS and a PMOS can be disposed in a peripheral part.

On the precondition that the number of steps be not to be increased, as described above, the buried layer 402 extends over the whole area of the substrate 401. In other words, it follows that the buried layer 402 is present also in the lower part where the MOS transistor is to be disposed. By way of example, a case where the substrate 401 and the epitaxial layer 403 are of the N type and the buried layer 402 is of the P type is considered.

When both N type wells and P type wells are disposed in a peripheral circuit part, the N type wells become electrically connected via the epitaxial layer 403 and obtain the same potential. However, the P type wells are in a separated state and electrically independent, and there is a possibility that the P type wells can be individually controlled.

In order to ensure a completely electrical isolation, the formation of a structure which leads to the lower buried layer 402 is the most important problem. When the P type wells and the buried layer 402 are connected, the multiple P type wells obtain the same potential via the buried layer 402. When a peripheral circuit is built by use of a CMOS, this limits the degree of freedom of the circuit and hence this is undesirable.

If the buried layer 402 is fabricated in an area except the peripheral circuit part and not over the whole area of the substrate 401, the isolation problem of P type wells is easy as described above. In this case, however, the number of steps increases and the mask problem arises. Thus in any case, problems related to the patterning of the buried layer 402 remain.

Furthermore, even when the P type wells are not connected directly to the buried layer 402, the impurity concentration of the epitaxial layer 403 is not more than the order of 1E15 ($1\times10^{15}$)/cm$^3$ at most. Therefore, it is difficult to ensure an electrical isolation of the P type wells in the parasitic bipolar structure of buried layer 402-epitaxial layer 403-P type wells.

The above-described situation applies to a case where all the conduction type are reversed.

SUMMARY OF THE INVENTION

Therefore, the present invention has as its object to ensure that in a photoelectric conversion device particularly having a buried layer in part of an anode and a cathode of a photodiode, such as a CCD having a sensor structure and a CMOS sensor, well of the same conduction type as the conduction type of the buried layer can be disposed in a peripheral circuit and that the potential of each well is independently controlled.

To solve the above-described problems, in the invention, it was contrived that in a region between a buried layer which extends over the whole area of a substrate and wells, there are disposed buried layer for well isolation of the same conduction type as the conduction type of an epitaxial layer and having a higher concentration than the epitaxial layer. As its technique, a manufacturing method which involves forming, by use of a resist mask used during well formation, the buried layers for well isolation under the well in a self-aligning manner without the addition of a special lithography step was simultaneously established.

A semiconductor device of the invention is constructed in such a manner that on a substrate surface there are disposed a buried layer of a conduction type opposite to the conduction type of the substrate and an epitaxial layer of the same conduction type as the conduction type of the substrate and that well of a conduction type opposite to the conduction type of the substrate are present in a part of the epitaxial layer. In this semiconductor device, a buried layer for well isolation being of the same conduction type as the conduction type of the substrate and having a higher concentration than the epitaxial layer is disposed between the lower parts of the well and the buried layer.

Also, a photoelectric conversion device of the invention is constructed in such a manner that on a substrate surface there are disposed a buried layer of a conduction type opposite to the conduction type of the substrate and an epitaxial layer of the same conduction type as the conduction type of the substrate and that well of a conduction type opposite to the conduction type of the substrate are disposed at an interval in part of the epitaxial layer. In this photoelectric conversion device, buried layers for well isolation being of the same conduction type as the conduction type of the substrate and having a higher concentration than the epitaxial layer is disposed between the lower parts of the wells and the buried layer and photodiodes and MOSFETs are disposed adjacent to each other correspondingly to the well of the opposite conduction type which are present spacedly.

A method of manufacturing a photoelectric conversion device of the invention comprising the steps of: forming on a semiconductor substrate a buried layer of a conduction type opposite to the conduction type of the substrate; depositing thereafter an epitaxial layer of the same conduction type as the conduction type of the substrate; forming well of a conduction type opposite to the conduction type of the substrate in part of the epitaxial layer; and forming under the well, by the ion implantation method, buried layer for well isolation of the same conduction type as the conduction type of the substrate which have a higher concentration than the epitaxial layer.

Particularly, in forming a buried layer of a conduction type opposite to the conduction type of the substrate over the whole surface of the semiconductor substrate, after the formation of a buffer layer over the whole surface of the substrate, a buried layer of a conduction type opposite to the conduction type of the substrate is formed by the ion implantation method and the buffer layer is removed.

Also, a method of manufacturing a photoelectric conversion device of the invention comprises the steps of: depositing on a semiconductor substrate an epitaxial layer of the same conduction type as the conduction type of the substrate; forming a buried layer of a conduction type opposite to the conduction type of the substrate by the ion implantation method; forming thereafter well of a conduction type opposite to the conduction type of the substrate in a part of the epitaxial layer; and forming under the well, by the ion implantation method, buried layer for well isolation being of the same conduction type as the conduction type of the substrate and having a higher concentration than the epitaxial layer.

According to a photoelectric conversion device of the invention, even when a buried layer which defines the lower part of a photodiode extends over a peripheral driving circuit part in building the photodiode and its driving circuit in the same substrate, it is possible to electrically isolate the buried layer from a well of the same conduction type above the buried layer. It has become possible to easily mount a peripheral circuit by a simple step.

Furthermore, in a method of manufacturing a photoelectric conversion device of the invention, when the high energy ion implantation method is used in disposing buried layers for well isolation of the same conduction type as the conduction type of the substrate under the well, it is possible to from the buried layer for well isolation without the addition of a special photo mask.

DESCRIPTION OF THE PREFERRED EMBODIMENTS

Figure 1:
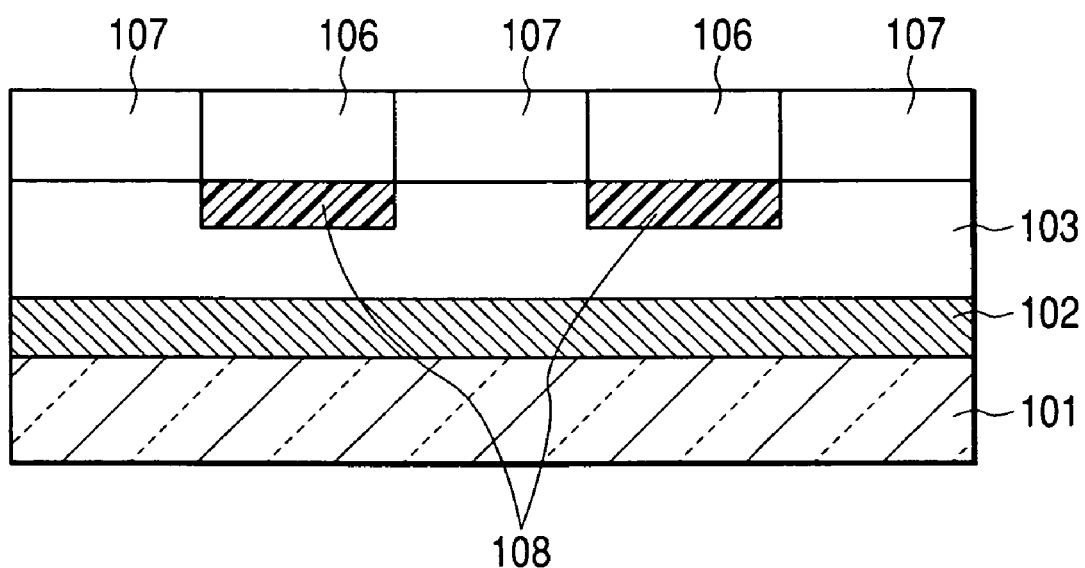
FIG. 1 is a conceptual drawing which shows the sectional structure of a photoelectric conversion device in the first embodiment of the invention.

Next, embodiments of the present invention will be described below by referring to the drawings.

FIG. 1 is a conceptual drawing which shows the sectional structure of a photoelectric conversion device in the first embodiment of the invention.

In the figure, the numeral 101 denotes a semiconductor substrate of Si etc. (the N type by way of example), the numeral 102 a buried layer which extends over the whole surface of the substrate (the P type, by way of example), the numeral 103 an epitaxial layer of the same conduction type as the conduction type of the substrate 101, the numeral 106 denotes a well of the same conduction type as the conduction type of the buried layer 102, and the numeral 107 a well of the same conduction type as the conduction type of the substrate 101. The numeral 108 denotes a buried layer for well isolation of the same conduction type as the conduction type of the epitaxial layer 103, and this buried layer for well isolation 108 is the essence of the invention. The well 106 and the buried layer 102 can be electrically isolated from each other by setting the concentration of this buried layer 108 sufficiently higher than the concentration of the epitaxial layer 103 and by disposing this buried layer 108 on the whole surface of the bottom of the well 106.

The fabrication process of the first embodiment of the invention will be described below.

FIG. 2A to FIG. 2D are each a conceptual drawing which shows the sectional structure of a photoelectric conversion device in each fabrication step in the first embodiment of the invention.

First, the Si substrate 201 is prepared. This substrate has a specific resistance of is 15 Ω·cm and N type conductivity. In order to form the buried layer 202, an $SiO_2$ film as a buffer film is first caused to grow with a thickness of 15 nm by the thermal oxidation method. Next, by use of the ion implantation method, boron is implanted in the whole area of the Si substrate 201 in a dosage of 8E13 ions/cm$^2$ and at an accelerating voltage of 60 keV. Next, in order to activate the ions, heat treatment at 900° C. for 30 minutes is performed in a nitrogen atmosphere. After that, the buried layer 202 is formed by removing $SiO_2$ of the buffer film with fluoric acid. (Refer to FIG. 2A.)

Next, by the CVD method which uses $SiHC_{13}$ an Si epitaxial layer 203 is caused to grow on the surface of the Si substrate. In this embodiment, an N type substance was caused to grow with a thickness of 4 μm and a specific resistance of is 10 Ω·cm in view of the spectral sensitivity of a sensor. (Refer to FIG. 2B.)

Figure 2A:
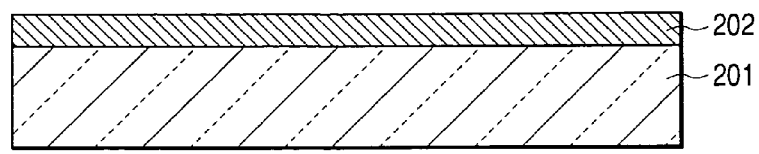
FIGS. 2A, 2B, 2C and 2D are each a conceptual drawing which shows the sectional structure of a photoelectric conversion device in each fabrication step in the first embodiment of the invention.
Figure 2B:
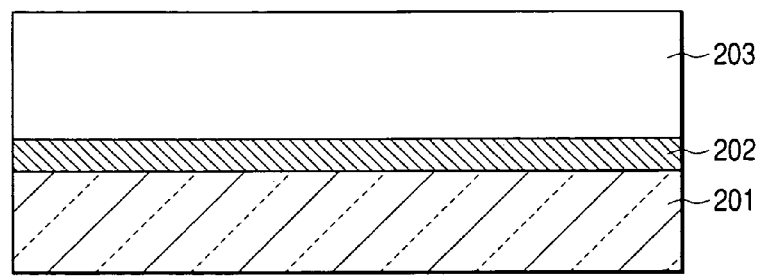
Figure 2C:
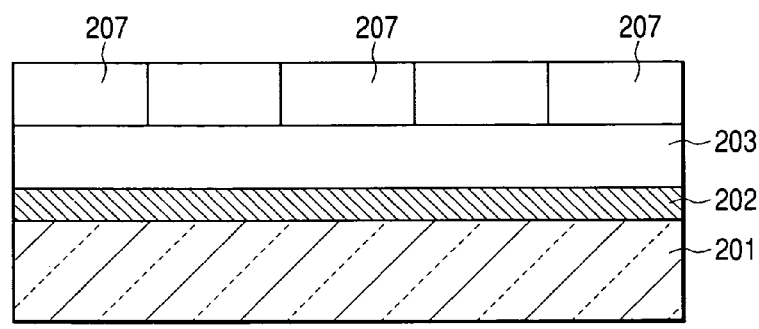
Figure 2D:
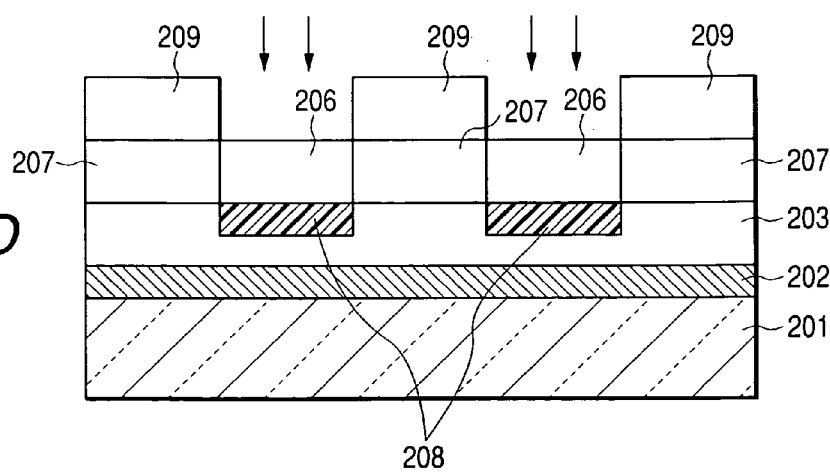

If separately from this embodiment, the epitaxial layer 203 is deposited directly on the substrate 201 and the buried layer 202 is then formed by use of a technique such as the high energy ion implantation method, it is possible to form a structure such as shown in FIG. 2B.

Next, regions of N type wells 207 were defined by the photolithography method in part of the epitaxial layer 203 and phosphorus and boron were implanted in the regions by the ion implantation method. Implantation conditions in this embodiment are as follows. First, phosphorus was implanted in the deepest regions in a dosage of $6E12$ ions/cm$^2$ and at an accelerating voltage of 360 keV, phosphorus was implanted in the intermediate regions in a dosage of $4E12$ ions/cm$^2$ and at an accelerating voltage of 180 keV, and boron was implanted on the outermost surfaces in a dosage of $3.8E12$ ions/cm$^2$ and at an accelerating voltage of 35 keV. The boron implanted on the outermost surfaces also serves as part of channel regions of PMOS transistors which are to be built later in the N type well regions. (Refer to FIG. 2C.)

Next, in part of the regions of the epitaxial layer 203 in which the N type wells 207 were not formed, regions of P type wells 206 are defined by resists 209, by use of the photolithography method. First, boron for forming the P type wells are implanted by the following three stages. Boron is implanted in the deepest regions in a dosage of $3E12$ ions/cm$^2$ and at an accelerating voltage of 250 keV, in the intermediate regions in a dosage of $2.5E12$ ions/cm$^2$ and at an accelerating voltage of 125 keV, and on the outermost surfaces in a dosage of $3.8E12$ ions/cm$^2$ and at an accelerating voltage of 35 keV.

If the resists are not exfoliated and phosphorus is implanted in a dosage of $1E12$ ions/cm$^2$ and at an accelerating voltage of 1.2 MeV subsequently to the above-described ion implantation, then it is possible to form N type buried layers for well isolation 208 in a self-aligning manner immediately under the P type wells 206. (Refer to FIG. 2D.)

If the resists 209 are removed after that, a structure as shown in FIG. 1 can be obtained.

In the case of the above-described embodiment, the peak concentration of the N type buried layers for well isolation 208 can have values of not less than $1E16/cm^3$ and become values which are not less than 2 orders of magnitude larger than the concentration of the epitaxial layer 203.

As a result of this, it has become possible to obtain sufficient electrical isolation between the P type buried layer 202 and the P type wells 206.

If after the formation of the above-described structure, photodiodes and MOS transistors are formed by a publicly known technique, it is possible to build a MOS type photoelectric conversion device in a single substrate. At this time, no special lithography step is added and the structure of FIG. 1 is formed by the addition of the phosphorus ion implantation step alone.

Furthermore, even when a CCD is formed in a succeeding step, the structure of FIG. 1 and the process flow of the embodiment shown in FIGS. 2A to 2D are effective and the embodiment plays a useful role in the formation of a CCD in which MOS circuits are integrated.

The second embodiment of the invention is an example in which a photodiode part and P type wells of peripheral NMOS are electrically isolated from each other.

Figure 3:
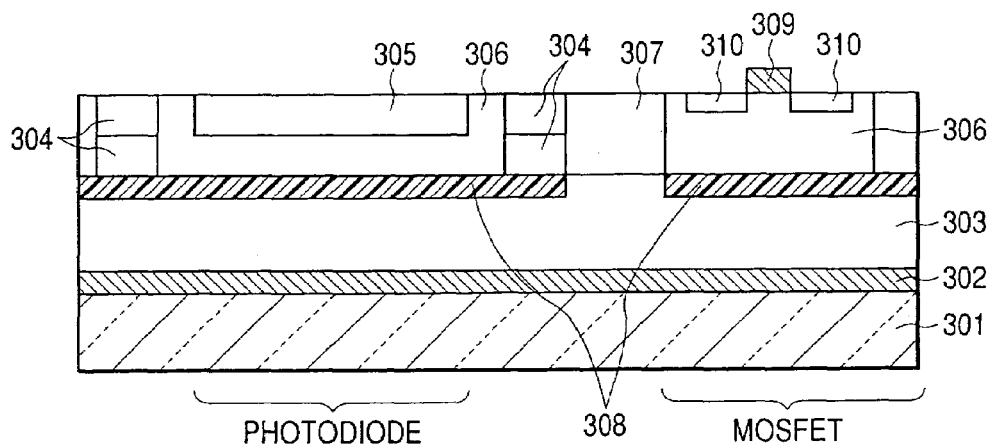
FIG. 3 is a conceptual drawing which shows the sectional structure of a photodiode part and a peripheral MOSFET part of a photoelectric conversion device in the second embodiment of the invention.
Figure 4:
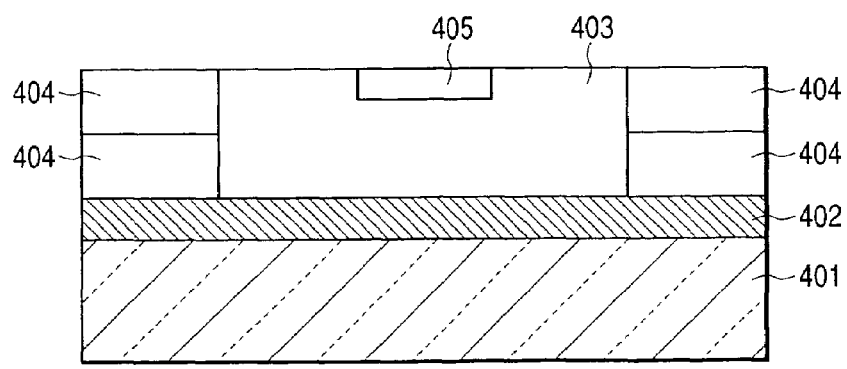
FIG. 4 is a conceptual drawing which shows the sectional structure of a photodiode part of a conventional photoelectric conversion device.

FIG. 3 is a conceptual drawing which shows the sectional structure of a photodiode part and a peripheral MOSFET part of a photoelectric conversion device in the second embodiment of the invention.

In FIG. 3, the numeral 301 denotes a semiconductor substrate, the numeral 302 a buried layer which extends over the whole area of the substrate, the numeral 303 an epitaxial layer, the numeral 304 a barrier diffusion layer of a photodiode, the numeral 305 a charge-accumulation diffusion layer of the photodiode, the numeral 306 a well of a conduction type opposite to the conduction type of the semiconductor substrate, the numeral 307 a well of the same conduction type as the conduction type of the semiconductor substrate, the numeral 308 a buried layer for well isolation of the same conduction type as the conduction type of the semiconductor substrate, the numeral 309 a gate electrode of NMOS, and the numeral 310 a source-drain region of the same conduction type as the conduction type of the semiconductor substrate.

This application claims priority from Japanese Patent Application No. 2003-321533 filed on Sep. 12, 2003, which is hereby incorporated by reference herein.

What is claimed is:

1. An image pickup device formed on a semiconductor substrate of a first conductivity type and having a first region in which photoelectric conversion elements are arranged, and a second region in which a peripheral circuit is arranged, comprising:

a first buried layer of a second conductivity type arranged on the semiconductor substrate, wherein the first buried layer extends from under the first region to under the second region;

an epitaxial layer of the first conductivity type arranged on the first buried layer, extending from under the first region to under the second region and electrically isolated from the semiconductor substrate by the first buried layer;

a well layer of the second conductivity type arranged within the epitaxial layer, wherein a source and drain of a MOSFET of the first conductivity type is formed in the well layer; and a second buried layer of the first conductivity type arranged at a bottom of the well layer and within the epitaxial layer, and doped with an impurity at a concentration higher than the epitaxial layer so as to electrically isolate the well layer from the first buried layer.

2. An image pickup device according to claim 1, wherein the well layer is provided in plurality, and the second buried layer is provided in plurality, wherein the plurality of well layers is arranged at an interval, and wherein the plurality of second buried layers is arranged correspondingly to the plurality of well layers.

3. An image pickup device according to claim 1, wherein the well layer is arranged in the second region.

4. An image pickup device according to claim 2, wherein the plurality of well layers is arranged in the second region, and wherein a region of the first conductivity type is arranged between the plurality of well layers.

5. An image pickup device according to claim 1, wherein the well region is arranged in the first region.

6. An image pickup device according to claim 5, wherein a photoelectric conversion element is arranged in the well layer, wherein a barrier diffusion layer of said photoelectric conversion element is farther provided, and wherein the second buried layer extends to a bottom of the barrier diffusion layer.

* * * * *

UNITED STATES PATENT AND TRADEMARK OFFICE
CERTIFICATE OF CORRECTION

PATENT NO. : 7,247,899 B2  
APPLICATION NO. : 10/937382  
DATED : July 24, 2007  
INVENTOR(S) : Kuwabara et al.

It is certified that error appears in the above-identified patent and that said Letters Patent is hereby corrected as shown below:

Title Page;

COVER SHEET:
(57) Abstract, Line 15, "layer, buried" should read -- layer, a buried --.

COLUMN 1:
Line 25, "Si etc." should read -- Si, etc., --;
Line 61, "process etc." should read -- process, etc., --; and
Line 67, "transistor, etc.," should read -- transistor, etc., --.

COLUMN 2:
Line 18, "completely" should read -- complete --;
Line 41, "type" should read -- types --; and
Line 56, "buried layer" should read -- buried layers --.

COLUMN 3:
Line 20, "is disposed" should read -- are disposed --.

COLUMN 4:
Line 3, "from" should read -- form --;
Line 32, "Si etc." should read -- Si, etc., --; and
Line 57, "of is" should read -- of --.

UNITED STATES PATENT AND TRADEMARK OFFICE
CERTIFICATE OF CORRECTION

PATENT NO. : 7,247,899 B2
APPLICATION NO. : 10/937382
DATED : July 24, 2007
INVENTOR(S) : Kuwabara et al.

It is certified that error appears in the above-identified patent and that said Letters Patent is hereby corrected as shown below:

COLUMN 5:
Line 5, Delete "is"; and
Line 29, "are implanted" should read -- is implanted --.

COLUMN 6:
Line 63, "farther" should read -- further --.

Signed and Sealed this

Eighth Day of April, 2008

JON W. DUDAS
*Director of the United States Patent and Trademark Office*